United States Patent
Chen et al.

(10) Patent No.: US 7,960,805 B2
(45) Date of Patent: Jun. 14, 2011

(54) MEMS STRUCTURE WITH SUSPENDED MICROSTRUCTURE THAT INCLUDES DIELECTRIC LAYER SANDWICHED BY PLURAL METAL LAYERS AND THE DIELECTRIC LAYER HAVING AN EDGE SURROUNDED BY PERIPHERAL METAL WALL

(75) Inventors: Jen-Yi Chen, Hsinchu County (TW); Chin-Horng Wang, Hsinchu (TW)

(73) Assignee: Industrial Technology Research Institute, Hsinchu (TW)

( * ) Notice: Subject to any disclaimer, the term of this patent is extended or adjusted under 35 U.S.C. 154(b) by 221 days.

(21) Appl. No.: 12/348,322

(22) Filed: Jan. 5, 2009

(65) Prior Publication Data
US 2010/0084723 A1    Apr. 8, 2010

(30) Foreign Application Priority Data
Oct. 2, 2008    (TW) ................................ 97137955 A

(51) Int. Cl.
*H01L 29/84* (2006.01)

(52) U.S. Cl. ................................ 257/415; 257/E29.324
(58) Field of Classification Search ............ 257/E29.324
See application file for complete search history.

(56) References Cited

U.S. PATENT DOCUMENTS

| | | | |
|---|---|---|---|
| 5,717,631 A | 2/1998 | Carley et al. | |
| 5,760,455 A | 6/1998 | Hierold et al. | |
| 5,970,315 A | 10/1999 | Carley et al. | |
| 6,943,448 B2 | 9/2005 | Gabriel et al. | |
| 7,202,101 B2 | 4/2007 | Gabriel et al. | |
| 7,829,365 B2 * | 11/2010 | Nakamura | 438/52 |
| 2010/0052179 A1 * | 3/2010 | Lan et al. | 257/773 |

* cited by examiner

*Primary Examiner* — Stephen W Smoot
(74) *Attorney, Agent, or Firm* — Jianq Chyun IP Office

(57) ABSTRACT

An MEMS structure and a method of manufacturing the same are provided. The MEMS structure includes a substrate and at least one suspended microstructure located on the substrate. The suspended microstructure includes a plurality of metal layers, at least one dielectric layer, and at least one peripheral metal wall. The dielectric layer is sandwiched by the metal layers, and the peripheral metal wall is parallel to a thickness direction of the suspended microstructure and surrounds an edge of the dielectric layer.

8 Claims, 10 Drawing Sheets

US 7,960,805 B2

MEMS STRUCTURE WITH SUSPENDED MICROSTRUCTURE THAT INCLUDES DIELECTRIC LAYER SANDWICHED BY PLURAL METAL LAYERS AND THE DIELECTRIC LAYER HAVING AN EDGE SURROUNDED BY PERIPHERAL METAL WALL

CROSS-REFERENCE TO RELATED APPLICATION

This application claims the priority benefit of Taiwan application serial no. 97137955, filed on Oct. 2, 2008. The entirety of the above-mentioned patent application is hereby incorporated by reference herein and made a part of specification.

BACKGROUND OF THE INVENTION

1. Field of the Invention

The present invention generally relates to a micro-electro-mechanical system (MEMS) structure and a method of manufacturing the same.

2. Description of Related Art

Recently, as the integrated circuit (IC) technique has been vigorously developed, an MEMS structure is fabricated through the mature complementary metal oxide semiconductor (CMOS) process technique. In addition, circuit and the MEMS structure are directly integrated on a single chip.

For example, a capacitive microphone structure is formed by a back plate filled with acoustic holes and a sensing film. When a pressure wave of a sound acts on the microphone, the sensing film moves relative to the back plate, such that a capacitance between the back plate and the sensing film is changed. Since the acoustic pressure is actually a slight pressure change, it requires high process accuracy and a high stability of the microphone.

However, recently, the materials formed through the CMOS technique employ a thin film process, such that a single layer of CMOS material used for providing the back plate of the microphone has structural strength issue to be considered.

SUMMARY OF THE INVENTION

Accordingly, the present invention is directed to an MEMS structure. The MEMS structure includes a substrate and at least one suspended microstructure located on the substrate. The suspended microstructure includes a plurality of metal layers, at least one dielectric layer, and at least one peripheral metal wall. The dielectric layer is sandwiched by the metal layers, and the peripheral metal wall is parallel to a thickness direction of the suspended microstructure and surrounds an edge of the dielectric layer.

The present invention is also directed to a method of manufacturing an MEMS structure, in which the MEMS structure includes at least one region with a suspended microstructure pre-formed therein. The manufacturing method includes the steps of providing a substrate, and then repeatedly performing following Step a to Step d on the substrate, that is, a) forming a dielectric layer; b) forming a plurality of metal walls in the dielectric layer, in which the metal walls respectively surround the region; c) forming a metal layer on the dielectric layer; and d) patterning the metal layer to expose a portion of the dielectric layer in the region. After repeatedly performing Step a to Step d, a structure-release etching process is performed, so as to remove the dielectric layer in the region, thereby forming the suspended microstructure.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

FIGS. 5A, 5B-1, 5C-1, 5D, and 5E-1 are cross-sectional views of a manufacturing process of an MEMS structure according to another embodiment of the present invention.

FIGS. 5B-2, 5C-2, and 5E-2 are respectively top views of FIGS. 5B-1, 5C-1, and 5E-1.

FIGS. 5C-3 and 5C-4 are other exemplary top views of FIG. 5C-1, respectively.

FIGS. 5E-3 and 5E-4 are other exemplary top views of FIG. 5E-1, respectively.

DESCRIPTION OF THE EMBODIMENTS

Figure 1:
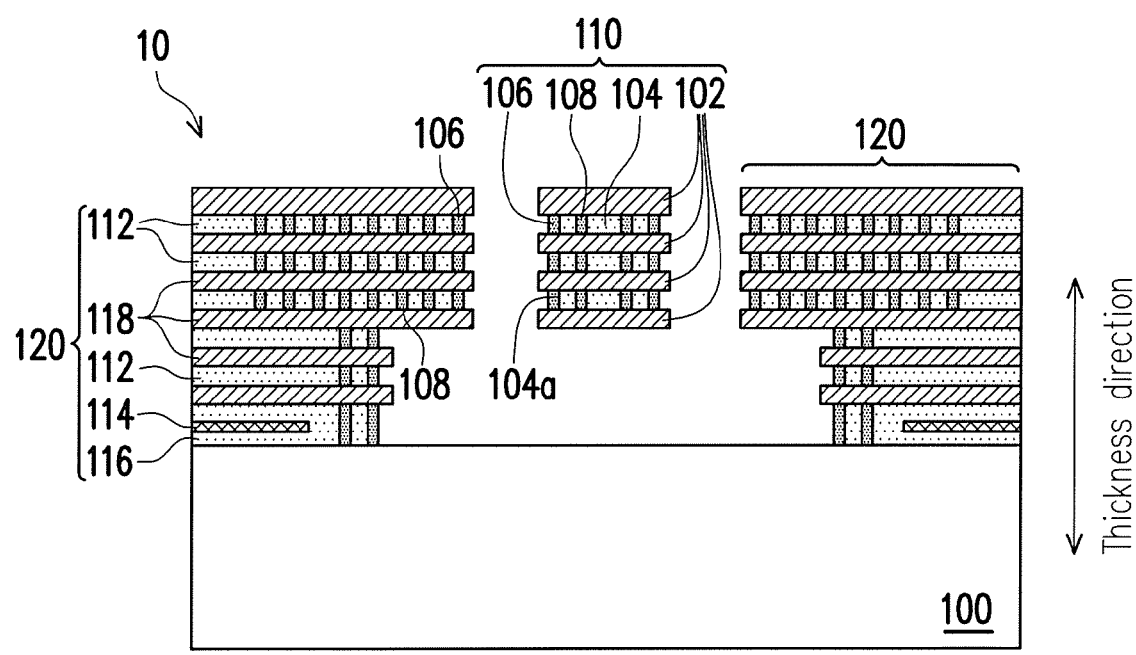
FIG. 1 is a schematic cross-sectional view of an MEMS structure according to an embodiment of the present invention.

Reference will now be made in detail to the present embodiments of the invention, examples of which are illustrated in the accompanying drawings. Wherever possible, the same reference numbers are used in the drawings and the description to refer to the same or like parts.

In an embodiment of the present invention, an MEMS structure is provided, which is suitable for enhancing a structural strength in a thickness direction, and a method of manufacturing an MEMS structure is also provided, so as to manufacture a structure with a high aspect ratio in a simple manner.

FIG. 1 is a schematic cross-sectional view of an MEMS structure according to an embodiment of the present invention.

Referring to FIG. 1, an MEMS structure 10 in this embodiment includes a substrate 100 and a suspended microstructure 110 located on the substrate 100. In FIG. 1, merely one suspended microstructure 110 is shown, but the present invention is not limited here. The suspended microstructure 110 includes metal layers 102, dielectric layers 104, and peripheral metal walls 106. Each dielectric layer 104 is sandwiched by the metal layers 102, and each peripheral metal wall 106 is parallel to a thickness direction of the suspended microstructure 10 and surrounds an edge 104a of the dielectric layer 104. In addition, the suspended microstructure 110 further includes inner metal walls 108 located in the dielectric layers 104 and parallel to the thickness direction of the suspended microstructure 10, so as to protect the dielectric layers 104 surrounded by the inner metal walls 108 from being etched by an etchant when the etchant leaks between the peripheral metal walls 106 and the inner metal walls 108. The structure constructed by the metal layers 102 and the dielectric layers 104 can enhance the structural strength of the suspended microstructure 110 in the thickness direction.

Referring to FIG. 1, the MEMS structure 10 in this embodiment further includes a peripheral structure 120 connected to the suspended microstructure 110. For example, the entire suspended microstructure 110 may be implemented through the current CMOS process, so the peripheral structure 120 usually includes inter-metal dielectric (IMD) layers 112, a poly-silicon layer 114, an inter-layer dielectric (ILD) layer 116, and metal layers 118, and also includes the peripheral metal walls 106 and the inner metal walls 108.

FIG. 1 is a cross-sectional view of the MEMS structure 10, so the connecting position between the peripheral structure 120 and the suspended microstructure 110 is not shown in FIG. 1.

Figure 2:
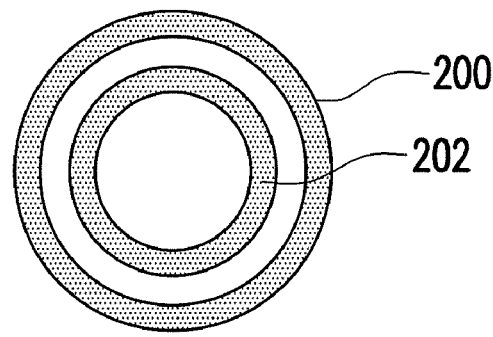
FIGS. 2 to 4 are top views of various geometrical structures of peripheral metal walls and inner metal walls of the MEMS structure shown in FIG. 1.
Figure 3:
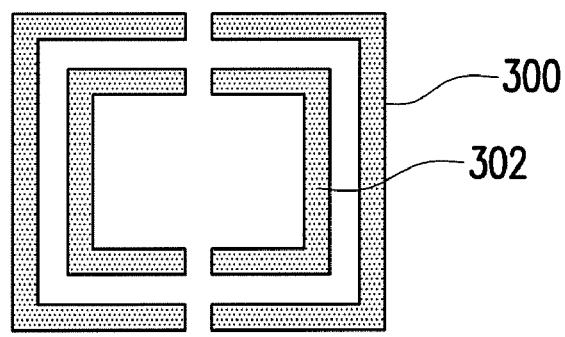
Figure 4:
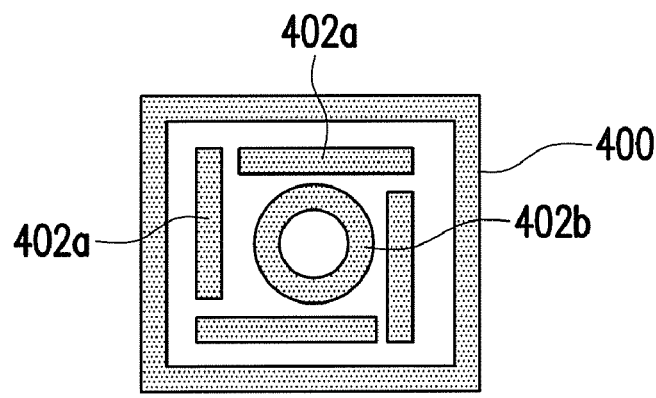

FIGS. 2 to 4 are top views of various geometrical structures of peripheral metal walls and inner metal walls of the MEMS structure shown in FIG. 1. Referring to FIGS. 2 to 4, the peripheral metal wall in the suspended microstructure may be a close type metal wall (as indicated by 200 of FIG. 2 and 400 of FIG. 4), and may also be a non-close type metal wall (as indicated by 300 of FIG. 3). The inner metal wall in the suspended microstructure may be a close type metal wall (as indicated by 202 of FIG. 2), a non-close type metal wall (as indicated by 302 of FIG. 3), or a close type and non-close type mixed metal wall (as indicated by 402a and 402b of FIG. 4). In addition, the geometric pattern of the peripheral metal wall may be varied depending upon the pattern of the suspended microstructure, for example, round (as indicated by 200 of FIG. 2), rectangular (as indicated by 300 of FIG. 3 and 400 of FIG. 4), or irregular geometric patterns. Similarly, the geometric pattern of the inner metal wall may be varied depending upon the region with the structural strength to be enhanced, for example, round (as indicated by 202 of FIG. 2 and 402b of FIG. 4), rectangular (as indicated by 302 of FIG. 3 and 402a of FIG. 4), or irregular geometric patterns.

Figure 5A:
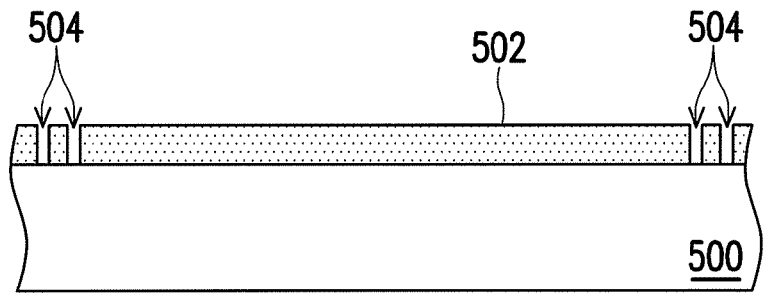
Figures 1, 5B:
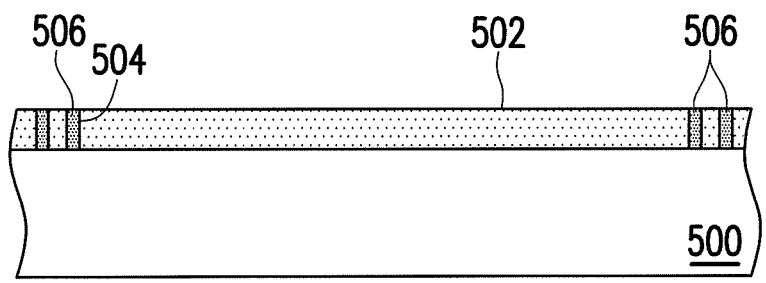
Figures 2, 5B:
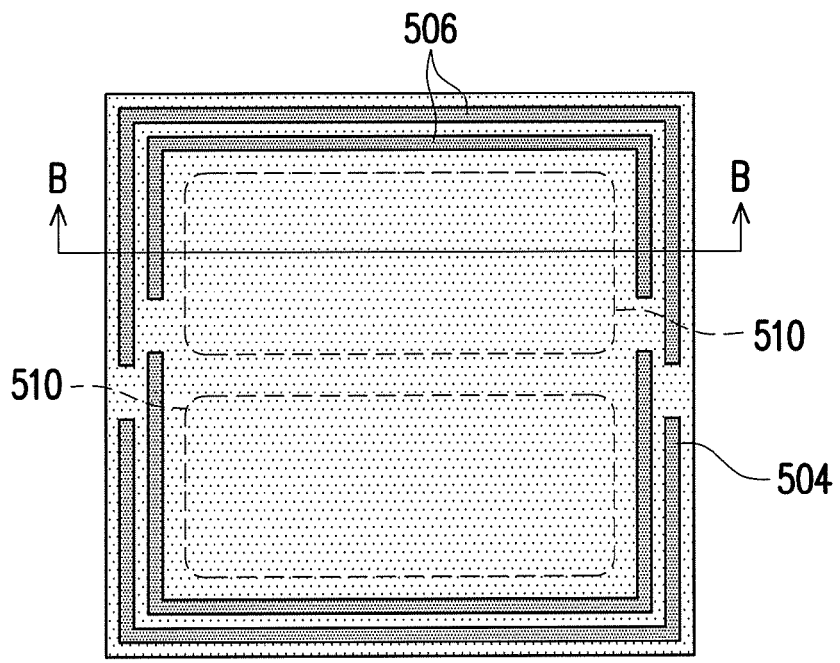
Figures 1, 5C:
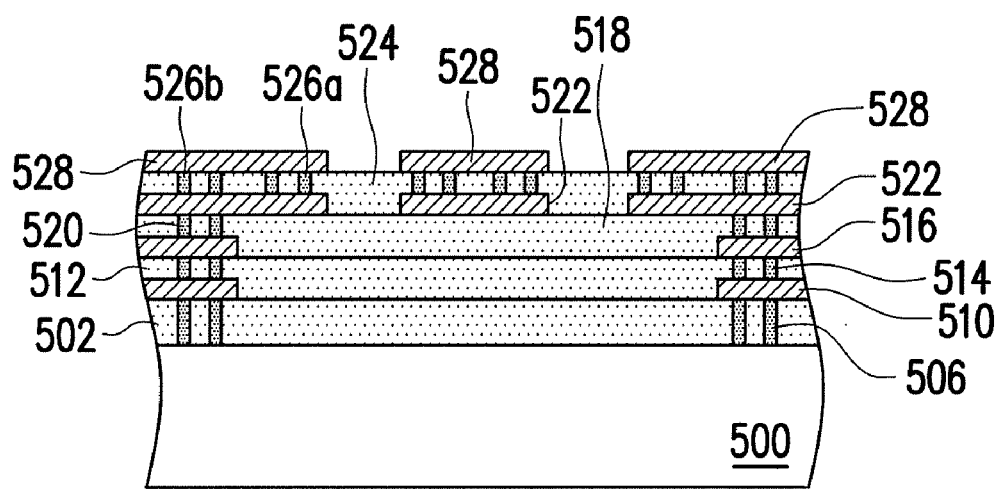
Figures 2, 5C:
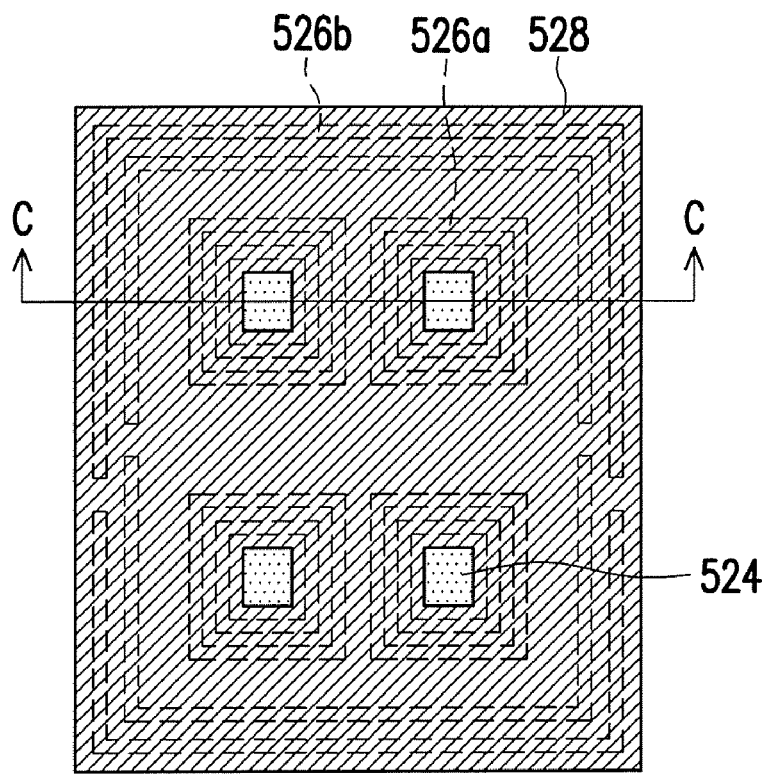
Figures 3, 5C:
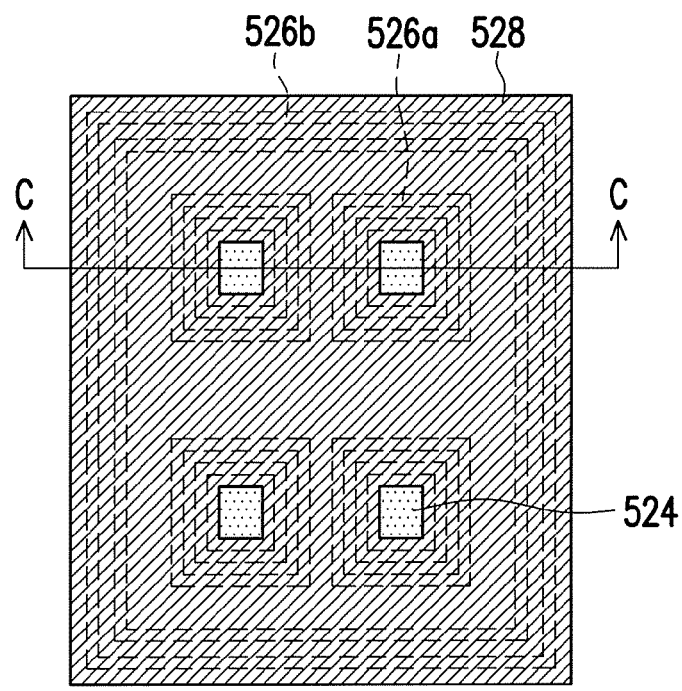
Figures 4, 5C:
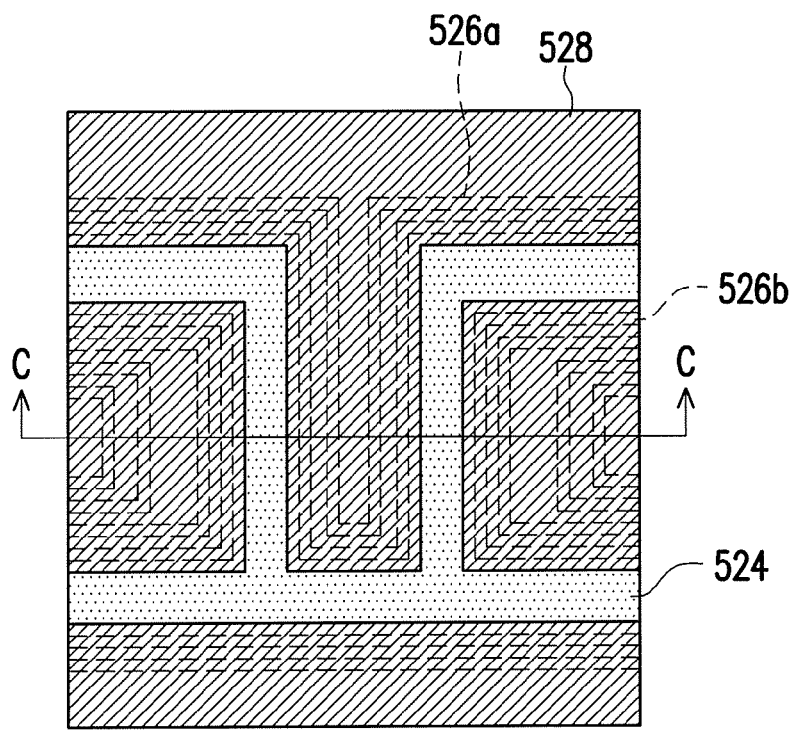
Figure 5D:
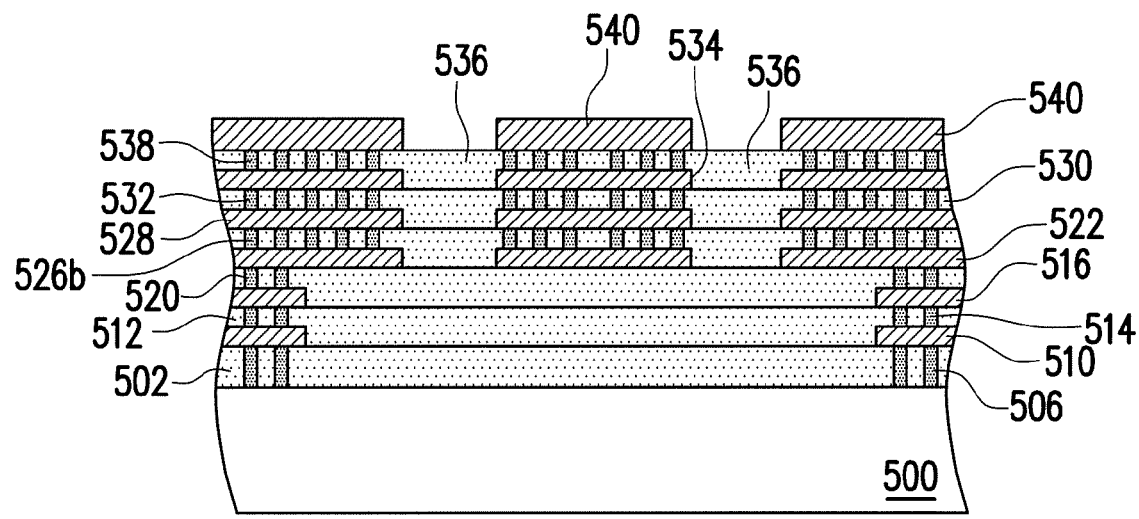
Figures 1, 5E:
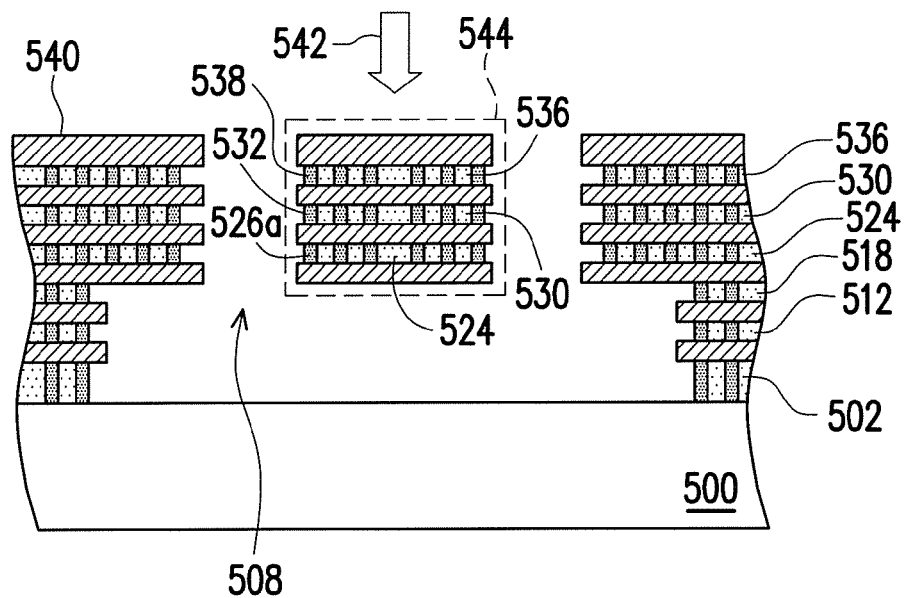
Figures 2, 5E:
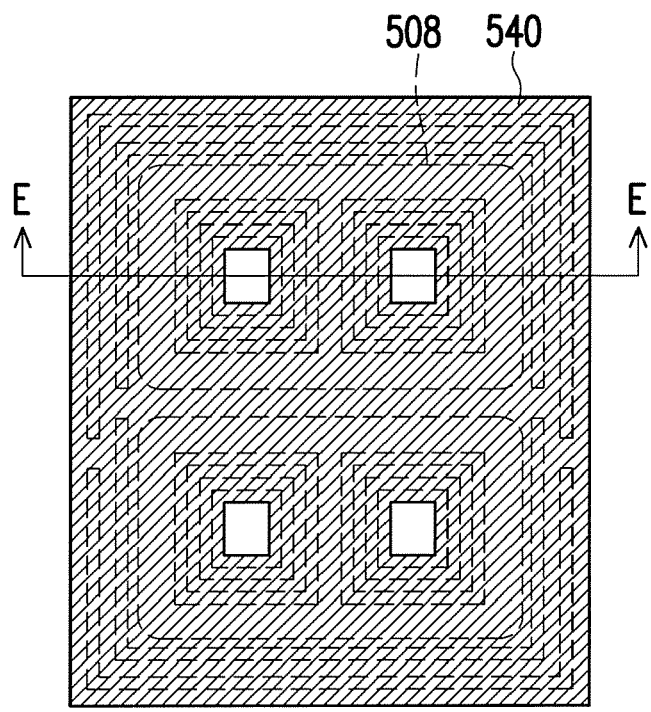
Figures 3, 5E:
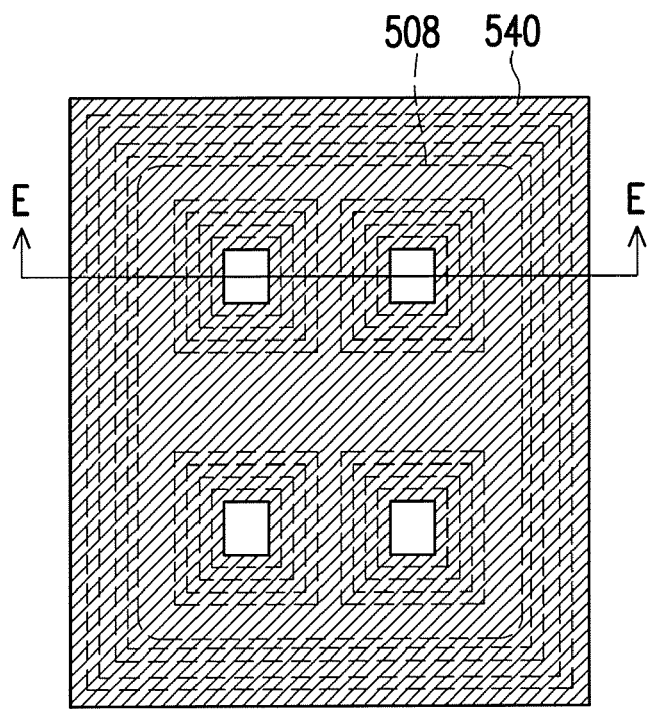
Figures 4, 5E:
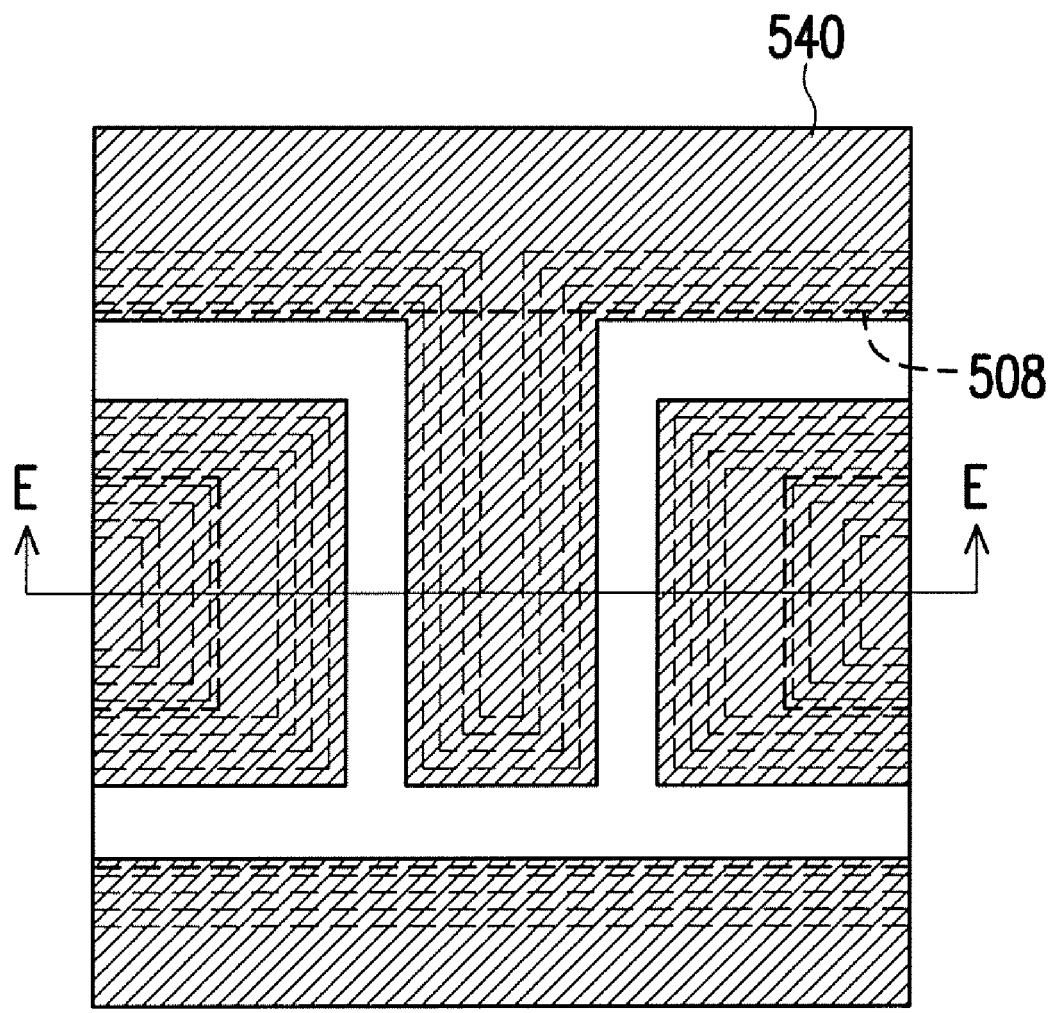

FIGS. 5A to 5E-4 are schematic views of a manufacturing process of an MEMS structure according to another embodiment of the present invention, in which FIGS. 5A, 5B-1, 5C-1, 5D, and 5E-1 are cross-sectional views, and FIGS. 5B-2, 5C-2, and 5E-2 are respectively top views of FIGS. 5B-1, 5C-1, and 5E-1. FIGS. 5C-3 and 5C-4 are other exemplary top views of FIG. 5C-1, respectively. In addition, FIGS. 5E-3 and 5E-4 are other exemplary top views of FIG. 5E-1, respectively.

Referring to FIG. 5A, in the manufacturing method of this embodiment, firstly, a substrate 500 is provided, in which the substrate 500 may be a silicon chip, or a silicon chip with a transistor and the like formed thereon through the CMOS process. Then, a dielectric layer 502 is formed on the substrate 500, and a plurality of openings 504 is formed in the dielectric layer 502.

Next, referring to FIGS. 5B-1 and 5B-2, a metal material is filled in the openings 504, so as to form a plurality of metal walls 506. The metal walls 506 respectively surround a region 508 where the suspended microstructure is pre-formed in the MEMS structure. In this embodiment, the metal walls 506 are non-close type metal walls, but the present invention is not limited here.

Then, referring to FIGS. 5C-1 and 5C-2, a metal layer 510 is formed on the dielectric layer 502, and then the metal layer 510 is patterned to expose a portion of the dielectric layer 502 in the region 508. The above steps are repeatedly performed twice, so as to form two dielectric layers 512 and 518, metal walls 514 and 520, and two metal layers 518 and 522. Then, a dielectric layer 524 is continuously formed on the substrate 500, and then metal walls 526a and 526b are formed in the dielectric layer 524. Then, a metal layer 528 is formed on the dielectric layer 524, and the metal layer 528 is patterned. The metal walls formed in this step are the close type metal wall 526a and the non-close type metal wall 526b.

In other embodiments, the metal walls 526b may be the close type metal walls as shown in FIG. 5C-3 or the metal walls 526a and 526b may be formed as shown in FIG. 5E-4 for subsequent formation of a suspension beam.

Then, in order to enhance the structural strength, referring to FIG. 5D, the steps of FIG. 5C-1 may be repeatedly performed for several times. For example, as shown in FIG. 5D, the above steps are repeated twice, so as to form two dielectric layers 530 and 536, two metal walls 532 and 538, and two metal layers 534 and 540.

Finally, referring to FIGS. 5E-1 and 5E-2, a structure-release etching process 542 is performed, so as to remove the dielectric layers 502, 512, 518, 524, 530, and 536 in the region 508, thereby forming a suspended microstructure 544. The structure-release etching process 542 is, for example, a wet etching or a dry etching. The edges of the dielectric layers 524, 530, and 536 in the suspended microstructure 544 are surrounded by the metal walls 526a, 532 and 538, so as to enhance the structural strength of the suspended microstructure 544 in the thickness direction. The metal walls 526a, 532, and 538 can protect the dielectric layers 524, 530, and 536 surrounded by the metal walls 526a, 532, and 538 from being affected by the structure-release etching process 542, when the etchant leaks into the suspended microstructure 544.

In other embodiments, the resulting suspended microstructure may be a totally suspended plate as shown in FIG. 5E-3, or a suspension beam as shown in FIG. 5E-4.

Figure 6A:
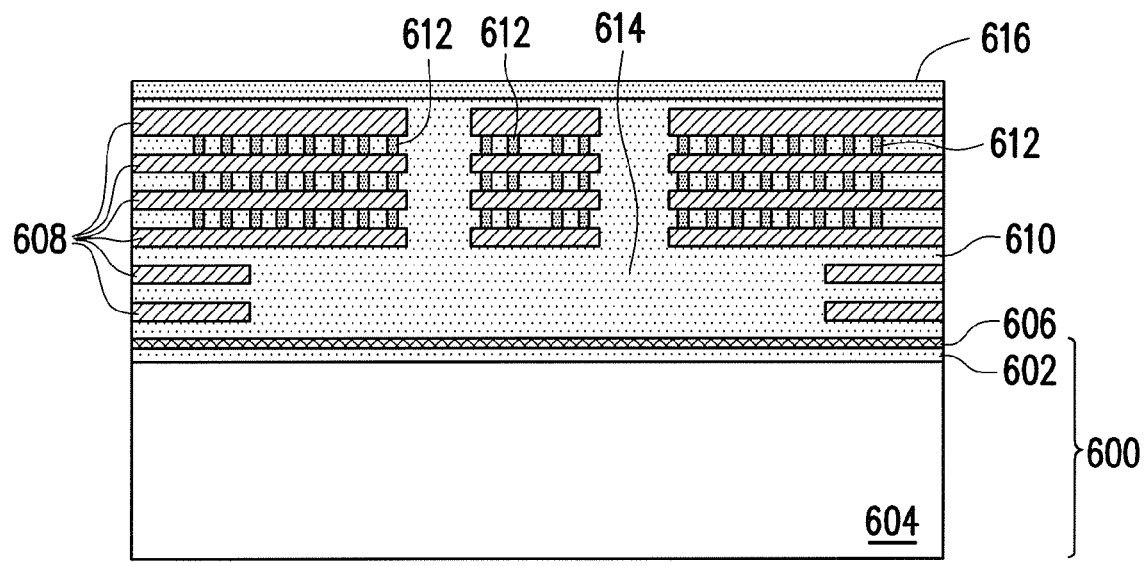
FIGS. 6A to 6C are schematic cross-sectional views of a manufacturing method of the present invention applied to manufacture a microphone structure.
Figure 6B:
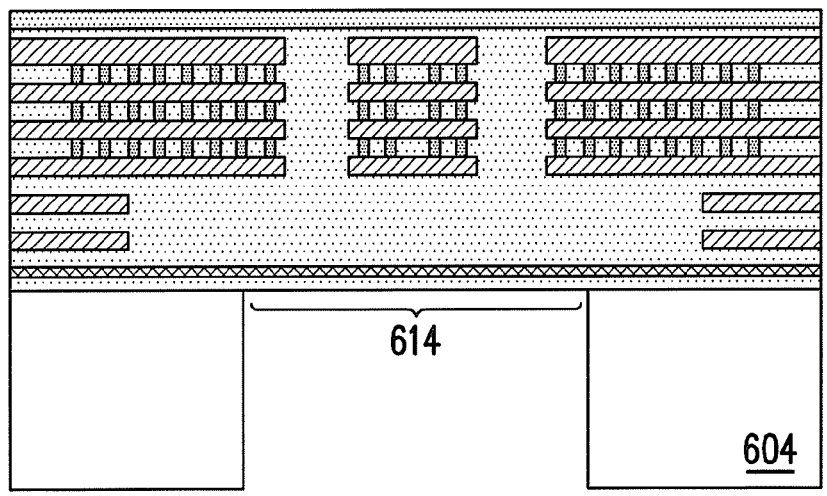
Figure 6C:
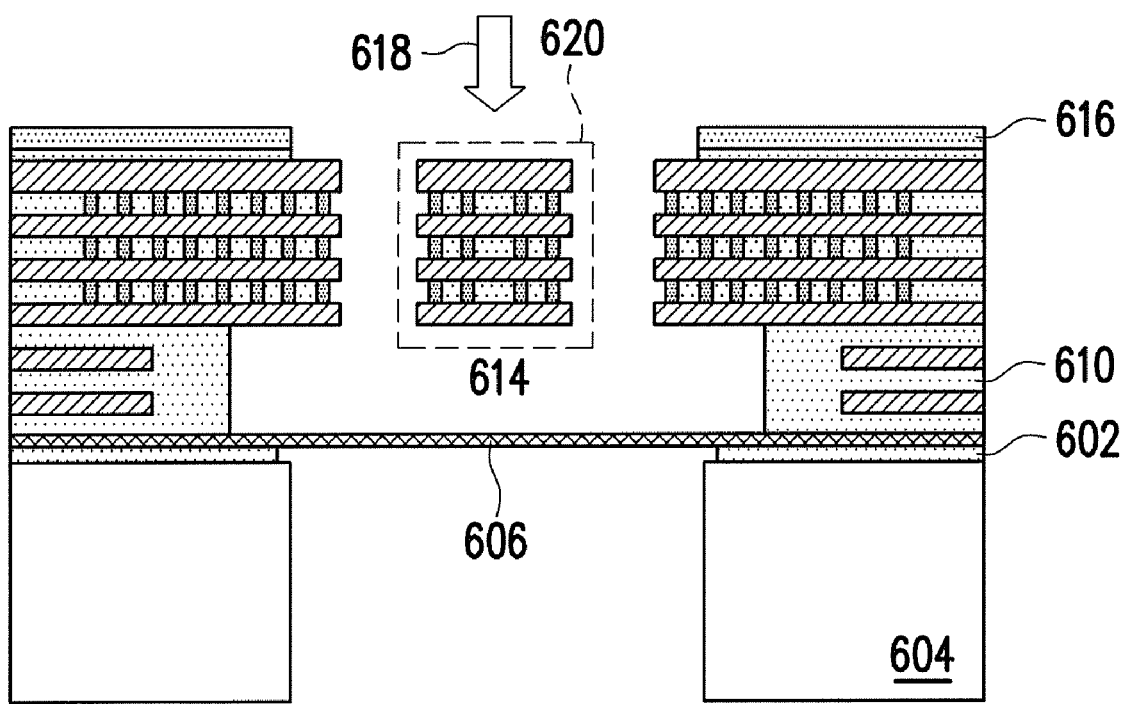

FIGS. 6A to 6C are schematic cross-sectional views of a manufacturing method of the present invention applied to manufacture a microphone structure.

Referring to FIG. 6A, firstly, a substrate 600 is provided, for example, a sensing film 606 is firstly formed on a silicon chip 604 with a dielectric layer 602 already formed thereon. Then, through the CMOS process, a structure similar to that shown in FIG. 5D including a plurality of metal layers 608, dielectric layers 610, and metal walls 612 is formed on the sensing film 606 of the silicon chip 604, and a suspended microstructure is predetermined to be formed in a region 614. In addition, a protective layer 616 is formed on the top of the structure.

Next, referring to FIG. 6B, a backside of the silicon chip 604 in the region 614 is removed.

Then, referring to FIG. 6C, a structure-release etching process 618 is performed, so as to remove both the dielectric layers 602 and 610 and the protective layer in the region 614, such that a suspended microstructure 620 is formed, and only the sensing film 606 of the microphone structure is left in the region 614.

In addition to the above application, the structure of the present invention may be further applied to an accelerator, a micro-mirror structure, and other MEMS structures, thereby enhancing the overall structural strength, and thus, the application is not limited to the microphone structure.

To sum up, the present invention is related to an MEMS structure with dielectric layers wrapped by a plurality of metal layers and metal walls is formed in a manner such as the CMOS process. Additionally, the structure may be formed in a form similar to the CMOS thin film material. Furthermore, the present invention is suitable for a structure-release etching process performed in a lateral etching manner. In addition, the manufacturing method based on of the present invention is entirely compatible with the CMOS process, which can be used together with a CMOS reading circuit for forming a system on a chip (SoC).

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A micro-electro-mechanical system (MEMS) structure, comprising:
    a substrate;
    at least one suspended microstructure, located on the substrate, wherein the at least one suspended microstructure comprises:
        a plurality of metal layers;
        at least one dielectric layer, sandwiched by the metal layers;
        at least one peripheral metal wall, parallel to a thickness direction of the suspended microstructure and surrounding an edge of the at least one dielectric layer; and
        a plurality of first inner metal walls, located in the at least one dielectric layer and parallel to the thickness direction; and
    a peripheral structure, connected to the at least one suspended microstructure, wherein the peripheral structure comprises a plurality of second inner metal walls disposed in the peripheral structure.

2. The MEMS structure according to claim 1, wherein the at least one peripheral metal wall is a close type or a non-close type metal wall.

3. The MEMS structure according to claim 1, wherein a geometric pattern of the at least one peripheral metal wall comprises round, rectangular, or irregular geometric patterns.

4. The MEMS structure according to claim 1, wherein the at least one peripheral metal wall is further disposed in the peripheral structure.

5. The MEMS structure according to claim 1, wherein the second inner metal walls are close type metal walls, non-close type metal walls, or close type and non-close type mixed metal walls.

6. The MEMS structure according to claim 1, wherein geometric patterns of the second inner metal walls comprise round, rectangular, or irregular geometric patterns.

7. The MEMS structure according to claim 1, wherein the first inner metal walls are close type metal walls, non-close type metal walls, or close type and non-close type mixed metal walls.

8. The MEMS structure according to claim 1, wherein geometric patterns of the first inner metal walls comprise round, rectangular, or irregular geometric patterns.

* * * * *